United States Patent [19]

Andren et al.

[11] Patent Number: 4,485,358
[45] Date of Patent: Nov. 27, 1984

[54] METHOD AND APPARATUS FOR PULSE ANGLE MODULATION

[75] Inventors: Carl F. Andren, Indiatlantic; William H. Mosley, Jr., St. Petersburg; David E. Sanders, Kenneth City, all of Fla.

[73] Assignee: E-Systems, Inc., Dallas, Tex.

[21] Appl. No.: 306,507

[22] Filed: Sep. 28, 1981

[51] Int. Cl.$^3$ ............................................. H03C 3/00
[52] U.S. Cl. ................................. 332/23 R; 455/102
[58] Field of Search ............ 332/9 R, 18, 23 R, 23 A, 332/21; 375/39, 50, 52, 57, 61, 67; 455/46, 47, 49, 50, 61, 63, 102

[56] References Cited

U.S. PATENT DOCUMENTS

| | | | |
|---|---|---|---|
| 3,391,344 | 7/1968 | Goldberg | 329/50 |
| 3,646,252 | 2/1972 | Verstraelen et al. | 178/5.4 |
| 3,675,131 | 7/1972 | Pickholtz | 325/329 |
| 3,699,462 | 10/1972 | Kietzer et al. | 329/112 |
| 3,746,996 | 7/1973 | Peoples | 325/330 |
| 3,761,829 | 9/1973 | Spaulding | 329/104 |
| 3,792,364 | 2/1974 | Ananias | 329/50 |
| 3,947,768 | 3/1976 | Desblache et al. | 333/18 X |
| 3,949,314 | 4/1976 | Machida | 329/107 |
| 4,090,145 | 5/1978 | Webb | 329/1 |
| 4,311,971 | 1/1982 | La Rosa | 332/9 R |

Primary Examiner—Siegfried H. Grimm
Assistant Examiner—W. R. Paxman
Attorney, Agent, or Firm—Albert M. Crowder, Jr.

[57] ABSTRACT

A method and apparatus for phase modulating a carrier signal to convey an information signal (12) such that the carrier signal has a constant amplitude envelope. A Hilbert transform signal (14) of the information signal (12) is produced. The signals (12, 14) are sampled to produce signals (16, 18), which represent cartesian coordinate values. The cartesian coordinate values are then converted into equivalent polar vectors (20-36) which have both an amplitude (R) and an angle ($\theta$). The polar vector quantity (R,$\theta$) is converted into two unity amplitude vectors (A, B). The unity amplitude vectors (A, B) are offset from the polar vector quantity by an angle the cosine of which is proportional to the amplitude of the polar vector (R). The carrier signal is sequentially phase modulated by each of the angles of the unity amplitude vectors (A, B) for each sample period of the information signal. This modulation procedure maintains a constant amplitude envelope for the carrier signal and makes possible simultaneous demodulation of a plurality of carrier signals in a single demodulation channel.

4 Claims, 22 Drawing Figures

METHOD AND APPARATUS FOR PULSE ANGLE MODULATION

TECHNICAL FIELD

The present invention pertains to radio communications and in particular to a method and apparatus for phase angle modulation.

BACKGROUND OF THE INVENTION

Heretofore the most widely used practice for sending voice communications with a hard limited transmitter was with the use of binary phase shift keying (BPSK), quadraphase shift keying (QPSK) modulation, or frequency modulation (FM). In order to minimize the spectrum occupancy of the transmitted signal a constant carrier envelope is required. Alternative techniques using amplitude modulation require linear transmitters since they do not have a constant envelope.

Where two such communication signals are received at a site for communication conferencing they are assigned to a common demodulation channel. When this occurs, the demodulated signals will contain components from the two communication signals, the resultant signal being modulated with the respective incoming signals. If the modulation is, for example, pulse duration modulation (PDM) then the recovered intermediate frequency (IF) signal is in effect, double sideband suppressed carrier modulated in a PDM fashion. Coherent recovery of this signal requires pre-injection of a phase coherent carrier signal to mix double sideband suppressed carrier signals to baseband. Inasmuch as there are two signals whose carriers are typically not the same frequency, there cannot be simultaneous demodulation of the two signals coherently to baseband. One or both of the incoming signals will therefore be highly distorted by this process. This problem can partially be solved by using non-coherent demodulation but this still leaves the problem of carrier amplitude modulation. Even though a double sideband suppressed carrier modulation signal has no average carrier, a carrier does exist instantaneously. Within a conference call the carriers will at times be equal and opposite in phase. They will cancel for that portion of time that the PDM signals are in the same state. This can occur during quiet periods to cause total carrier loss for significant periods of time. Since the carriers are not likely to have precisely the same frequency, they will alternately cancel and add in such a manner that the resulting demodulated audio signal and noise will be amplitude modulated at the rate of the difference of the carrier frequencies.

In view of the above problems there exists a need for a phase modulation system which has a constant carrier envelope for transmission through non-linear transmitter stages and which likewise can be demodulated non-coherently in a conventional single sideband manner without carrier beat.

DISCLOSURE OF THE INVENTION

The present invention comprises a method and apparatus for phase modulating a carrier signal to produce a constant amplitude carrier envelope and enable the demodulation of a plurality of carrier signals in a single demodulation channel. The modulation format of the present invention comprises two unity amplitude phase modulated signal elements for each signal period of the transmitted signal. A Hilbert transform of the modulation signal is produced and sampled in time coincidence with sampling of the information signal to produce orthogonal signal samples of both the modulation signal and the Hilbert transform signal. The two time coincident signal samples are treated as cartesian coordinates and transformed into an equivalent polar vector quantity having an amplitude and an angle. The polar vector quantity is converted into two unity amplitude vectors each of which is phase offset from the polar vector by an angle the cosine of which is proportional to the amplitude of the polar vector. The carrier signal is phase modulated to sequentially have each of the phase angles of the unity amplitude vectors for each sample period of the modulation signal. The carrier signal thereby has the desired constant amplitude envelope.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

The present invention comprises a method and apparatus for phase modulating a carrier such that the modulated carrier has a constant envelope characteristic and has a zero carrier component without spectrum spreading of the IF signal. The carrier modulation technique described herein is entitled Pulse Angle (PANG) Modulation and is especially applicable for use in a conferencing communication system.

Figure 1:
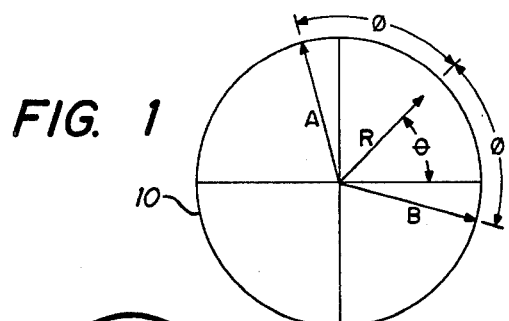
FIG. 1 is a vector diagram showing the derivation of the unit vectors representing the transmitted quantity.

In the present invention an input signal, usually audio, is processed through a Hilbert transformer which is a circuit that produces continuous output that has a 90 degree phase shift for each signal component of the input audio signal. The combination of the audio signal and the Hilbert transformed audio signal make up a cartesian coordinate set for the audio signal at each sample point thereof. In general, both the original audio signal and the Hilbert transform are sampled at a standard rate, such as 8 KHZ, and the samples are combined geometrically as cartesian vectors to produce a resultant vector (R) and a corresponding angle $\theta$. In other words the audio signals are sampled and the vectors therefrom are converted from a cartesian coordinate system into a polar coordinate system having the resultant vector R and the angle $\theta$. These quantities are illustrated in FIG. 1. The vector circle 10 has vector R extending outward and rotated at an angle of $\theta$ from the positive X axis. In order to maintain a constant envelope characteristic the modulation technique of the present invention produces two vectors of unity amplitude, A and B, for each of the pairs of samples corresponding to the resultant vector R. The unity vectors A and B are each phase offset from the resultant vector R by an angle of $\phi$. This is an angle which is proportional to the amplitude of the resultant vector R and is defined as being the angle whose cosine is R/2 where R is in the range from zero to two. From the above discussion it can be seen that the relations of the vectors are given by the following equations where X is the amplitude of the audio signal at the sample time and Y is the amplitude of the Hilbert transform signal at the sample time.

Amplitude of vector $R = X^2 + Y^2$ $\theta = TAN^{-1} [X/Y]$ $\phi = COS^{-1} [R/2] \quad 0 \leq R \leq 2$ Angle of vector $A = \theta + \phi$ Angle of vector $B = \theta - \phi$ In the present invention the carrier signal is modulated during each signal period to have sequentially the phase modulation indicated by vector A and by vector B. Thus, there are two signal elements for each signal period and the signal elements can take on any value of phase angle.

Figure 2A:
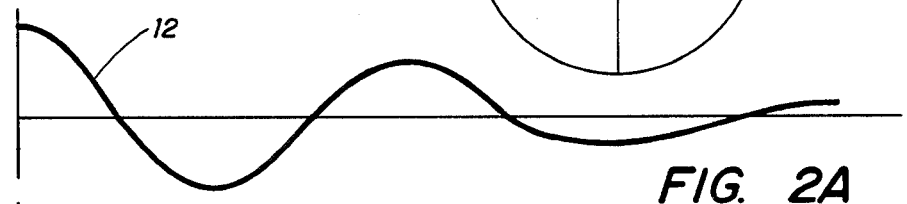
FIG. 2A is a typical modulation signal.
Figure 2B:
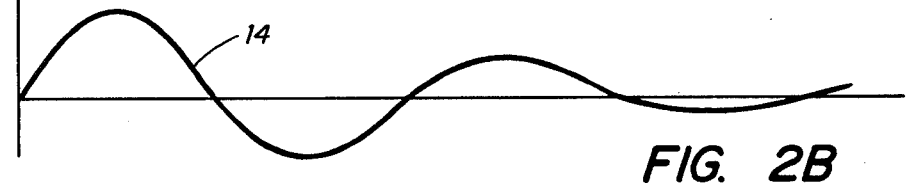
FIG. 2B is a Hilbert transform of the modulation signal shown in FIG. 2A.
Figure 2C:
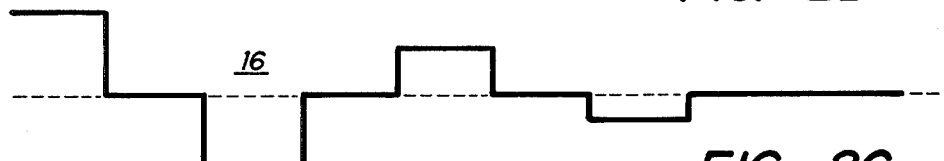
FIG. 2C is a signal produced by a sample and hold circuit which receives the modulation signal shown in FIG. 2A.
Figure 2D:
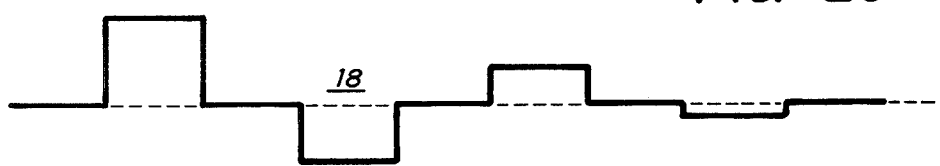
FIG. 2D is a signal produced with a sample and hold circuit receiving the Hilbert transform signal shown in FIG. 2B.

The method of the present invention is illustrated diagrammatically in FIGS. 2A–2G. A modulation signal 12 is shown in FIG. 2A. Signal 12 is typically an audio signal. A Hilbert transform of the modulation signal 12 is illustrated in FIG. 2B. The Hilbert transform is shown as signal 14. The signal produced by a Hilbert transformer has each of the frequency components of the input signal shifted by 90 degrees. Both the modulation signal 12 and Hilbert transform signal 14 are sampled at a given rate such as, for example, 8 KHZ so that the audio information content of the signal is maintained in the samples. Each sample is held for the duration of the sample period. Sample signal 16 shown in FIG. 2C represents the samples of modulation signal 12 and sample signal 18, shown in FIG. 2D, represents the samples taken of Hilbert transform signal 14. Each of the sampled states corresponds to the amplitude of the corresponding signal at the instant that the sample is taken. The sample is then held at that value for the duration of the sampling period.

Figure 2E:
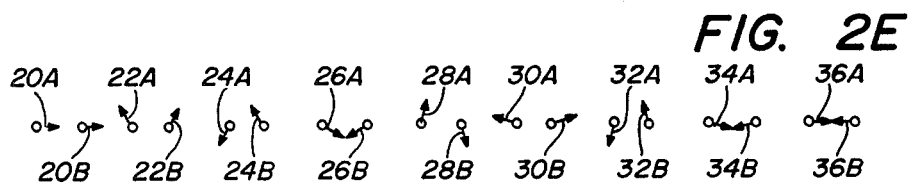
FIG. 2E illustrates the resultant cartesian vectors produced from the time coincident samples shown in FIGS. 2C and 2D.

The samples taken at each sampling period for both the modulation signal 12 and the Hilbert transform signal 14 are combined geometrically in a cartesian coordinate to polar coordinate conversion to produce a resultant vector R as illustrated in FIG. 2E. The R vectors 20–36 correspond respectively to the cartesian samples in the immediately superior sample signals in FIGS. 2C and 2D.

Figure 2F:
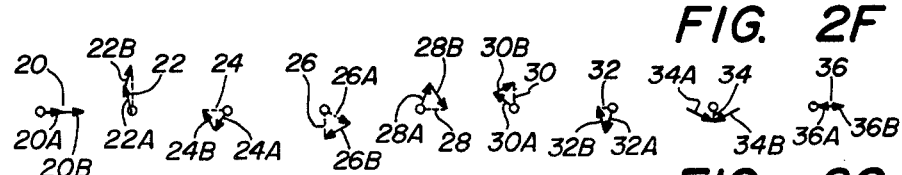
FIG. 2F illustrates the unit vectors produced from each of the resultant vectors shown in FIG. 2E.

Referring to FIG. 2F, further in accordance with the present invention, each of the R vectors 20–36 is resolved into a pair of unity vectors, A and B, which when vectorially summed produce the corresponding R vector. The unity A vectors are shown as 20A–36A and the unity B vectors are shown as 20B–36B. In accordance with the present invention the carrier signal is phase modulated in accordance with the vectors 20A–36A and 20B–36B wherein the A and B vectors alternately modulate the carrier signal during each signal period.

Figure 2G:
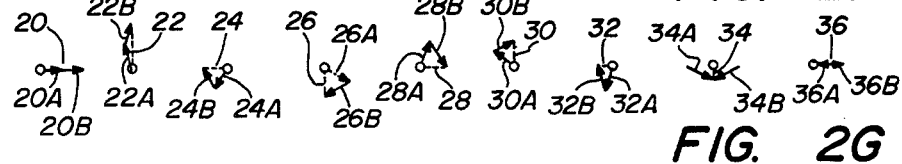
FIG. 2G illustrates the reproduction of the resultant vectors utilizing the unit vectors shown in FIG. 2F.

Referring now to FIG. 2G the A and B vectors are vectorially summed at the receiving terminal to reproduce the original R vector and phase angle $\theta$ corresponding to the polar coordinates representing the two samples for the modulation signal 12 and the Hilbert transform signal 14. As can be seen in FIG. 2G the combination of the A and B vectors produces the corresponding R vector as shown in FIG. 2E. After the resultant vector R and corresponding phase angle $\theta$ are recovered at the receiving terminal the samples of the modulation signal can be reconstituted to reproduce the modulation signal itself at the receiving terminal.

Apparatus for carrying out the method of the present invention is illustrated in FIGS. 3–16.

Figure 3:
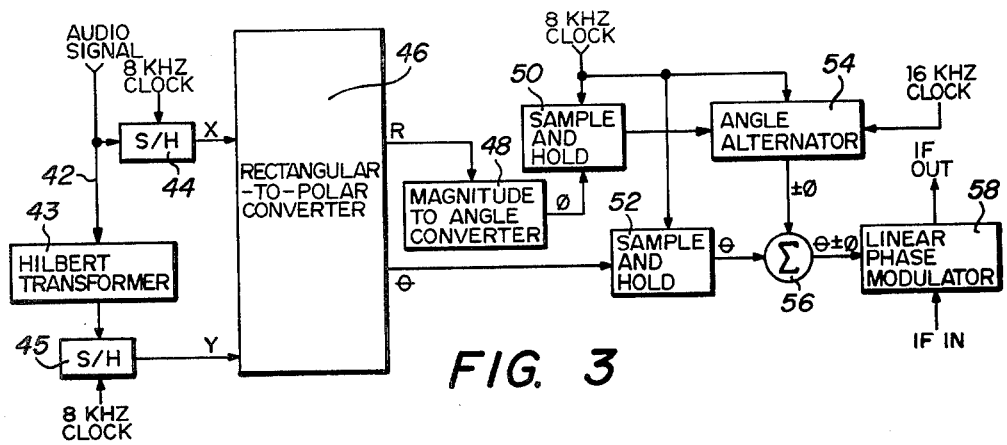
FIG. 3 is a functional block diagram of a pulse angle modulator in accordance with the present invention.

In FIG. 3 there is illustrated a functional block diagram of a pulse angle modulator in accordance with the present invention. An audio signal is input on line 42, the audio signal corresponding to the modulation signal 12 illustrated in FIG. 2A. In terms of the cartesian coordinate system this signal is arbitrarily defined as being the X coordinate. The audio signal is also input to a Hilbert transformer 43. The output signal from the Hilbert transformer 43 is arbitrarily defined to be the Y coordinate in the cartesian coordinate system. A Hilbert transformer is described in detail below.

The audio input signal and its Hilbert transform are input to sample and hold circuits 44 and 45 respectively.

The audio signal sample and the corresponding Hilbert transform sample are then input to a rectangular to polar converter 46 which produces polar vector R at phase angle $\theta$ at its output terminals. The vector R from converter 46 is input to a magnitude-to-angle converter 48 to produce an angle $\theta$ signal which is proportional to the magnitude of the vector R. A magnitude-to-angle converter is described below.

The angle θ signal from converter 48 is input to a sample and hold circuit 50. Likewise the angle θ signal is input to a sample and hold circuit 52. The sample and hold circuits 50 and 52 are each driven by a clock signal at a rate of 8 kilohertz in an audio transmission system described herein, although a higher frequency clock would be used for systems transmitting signals with greater bandwidths.

The signal samples produced by sample and hold circuit 50 are input to an angle alternator 54 which changes the sign of the angle φ signal at a rate of 16 khz. In this manner the angle φ signal is subtracted and added twice during each signal period. Therefore, the output of the angle alternator 54 is a signal which is alternately proportional to the positive and negative of the angle φ.

The angle θ signal, as produced by the sample and hold circuit 52 and the positive and negative angle φ, as produced by angle alternator 54, are input to a summation circuit 56 which produces an output θ±φ signal with the sign changes occurring at the rate of the 16 khz clock signal. The summation signal from circuit 56 is input to a linear phase modulator 58 which also receives a locally generated IF signal. The IF signal is phase modulated to produce a single sideband IF output signal having the pulse angle modulation defined in accordance with the present invention. A linear phase modulator is described in detail below.

Figure 4:
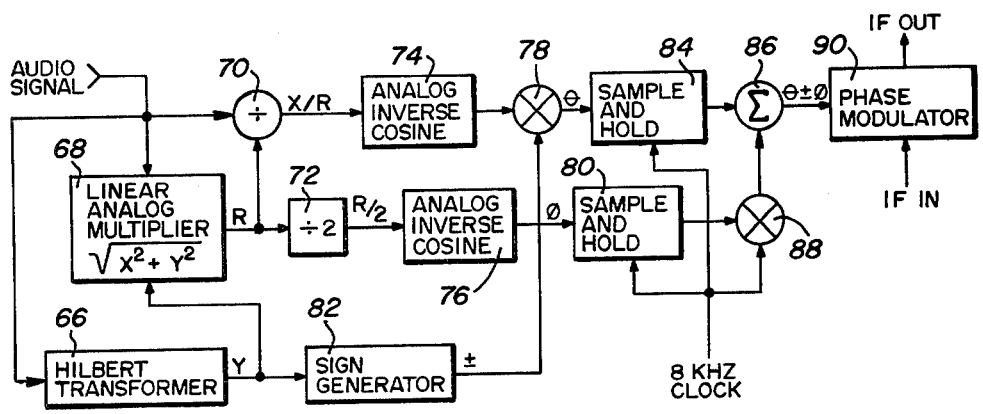
FIG. 4 is a block diagram of a pulse angle modulator in accordance with the present invention.

A block diagram for a further modulator in accordance with the present invention is shown in FIG. 4. An audio signal, as shown in FIG. 2A, is input to a Hilbert transformer 66, a linear analog multiplier 68 and a divider circuit 70. The convention defined above for the audio signal described in FIG. 3 is likewise adopted for the description of the circuit in FIG. 4. The audio signal itself is represented by the cartesian coordinate X while the Hilbert transform of the audio signal is represented by the cartesian coordinate Y. The linear analog multiplier 68 produces the resultant vector R signal which is the square root of the sum of the squares of the quantities X and Y. The vector R signal is produced continuously as an analog signal which is supplied to a divide-by-two circuit 72 and to the divider circuit 70. The divider circuit 70 produces a quantity which is proportional to the cartesian coordinate value X divided by the resultant vector R. The circuit 72 produces an analog signal proportional to the quantity R/2.

The quantities X/R and R/2 are input respectively to analog inverse cosine circuits 74 and 76. The outputs of the analog inverse cosine circuits 74 and 76 are input respectively to a mixer 78 and a sample and hold circuit 80.

The sign of the Y signal, from transformer 66, is selected by a sign generator 82 which provides a signal corresponding to positive and negative signs to the mixer circuit 78 thereby causing the output of the mixer 78 to be a correct angle value depending on the quadrant in which the Y component resides.

The output of the mixer 78, the angle φ signal is transmitted to a sample and hold circuit 84 which provides a sample signal to a summation circuit 86. The sample and hold circuit 80 provides a sample signal which corresponds to the angle φ, to a mixer 88. The mixer 88 is driven by a clock signal, which in this embodiment, is at a rate of 8 khz. The sample and hold circuits 80 and 84 are each driven by the same clock signal which drives the mixer 88. The mixer 88 reverses the polarity of the angle φ signal at a rate of 16 khz such that two phase angles are modulated on the carrier signal during each signal period.

The output of the summation circuit 86 is a signal proportional to the angle θ±φ. This signal is transmitted to a phase modulator 90 to phase modulate an IF signal and thereby produce a phase angle modulated signal in accordance with the present invention. The IF output signal from modulator 90 is used as a single sideband signal.

Referring further to FIG. 4, the analog modulation signal is converted to cartesian coordinates X and Y which are in turn used to produce the corresponding polar coordinate values for vector R at phase angle θ. The signals corresponding to these values are sampled at a rate to insure complete transmission of the audio signal. The signal samples are then summed to produce phase modulation at a rate of 16 khz so that two phase angles are modulated on the carrier during each signal period. Thus, the embodiment illustrated in FIG. 4 carries out PANG modulation as described in reference to FIGS. 1 and 2.

Figure 5:
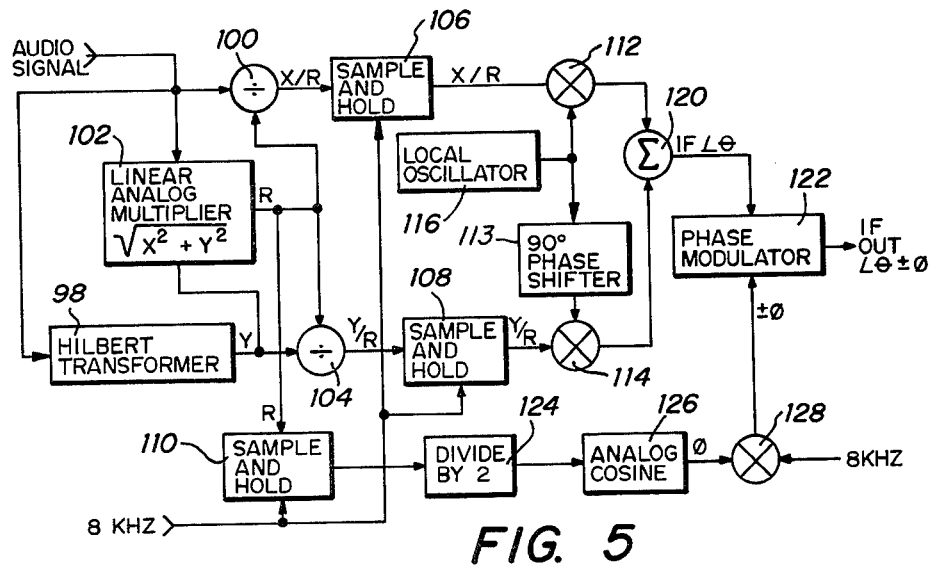
FIG. 5 is a block diagram of a further embodiment of a pulse angle modulator in accordance with the present invention.

A further embodiment of a modulator for use in accordance with the present invention is illustrated in block diagram form in FIG. 5. An audio signal is input to a Hilbert transformer 98 and to a divider circuit 100 in the same manner as described for the circuit shown in FIG. 4. Likewise the X and Y cartesian component signals defined above are input to a linear analog multiplier 102 to produce the resultant quantity for vector R. The divider 100 produces the quantity X/R while a divider 104 produces the quantity Y/R.

The signal X/R is input to a sample and hold circuit 106 and the signal Y/R is input to a sample and hold circuit 108. In a similar fashion the vector R signal, produced by multiplier 102, is input to a sample and hold circuit 110. Sample and hold circuits 106, 108 and 110 are driven by a clock signal which has a preferred rate of 8 khz.

The sampled X/R signal, produced by sample and hold circuit 106, is transmitted to a mixer 112. Likewise the sampled Y/R signal, generated by sample and hold circuit 108, is transmitted to a mixer 114.

A local oscillator 116 generates an IF signal which is transmitted directly to the mixer 112 and is also transmitted through a 90 degree phase shifter 113 to the mixer 114. Thus, the mixers 112 and 114 receive signals which are in quadrature. The output of mixers 112 and 114 are transmitted to a summation circuit 120 which produces an IF signal having a phase angle θ. This phase modulated IF signal is provided to the input terminal of a phase modulator 122.

The polar quantity for the vector R signal is sampled by the circuit 110 which produces a series of sequential signal samples at a rate of 8 khz. This sampled signal is transmitted to a divide-by-two circuit 124. The output of circuit 124 is at the rate of 8 khz and is provided to an analog cosine circuit 126 which generates the cosine of the angle proportional to the input signal. The cosine signal from circuit 126 is provided as a first input to a mixer 128. The second input to mixer 128 is an 8 khz clock signal which causes the sign of the φ signal to be changed twice per signal period.

The alternating sign signal produced by mixer 128 is utilized to phase modulate the IF signal input to phase modulator 122. During each time period the IF signal, which has previously been modulated to have the phase angle θ, is then modulated twice per signal period to alternately add and subtract the phase angle φ. Thus, the output of phase modulator 122 is a modulated carrier signal having phase modulation in accordance with the present invention as described in FIGS. 1 and 2.

Figure 6:
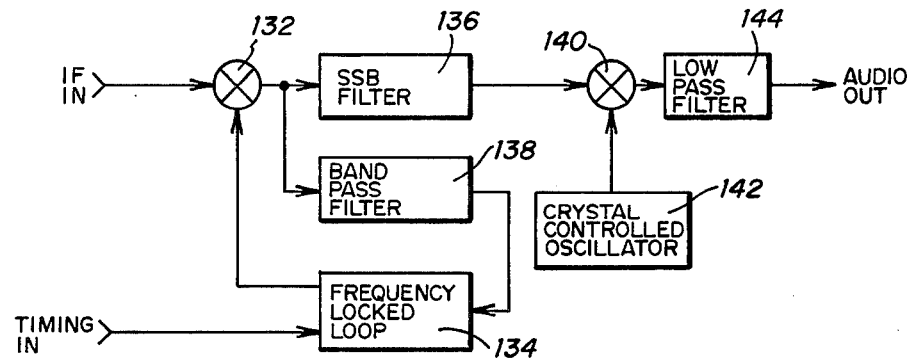
FIG. 6 is a block diagram of a demodulator in accordance with the present invention.

Referring now to FIG. 6, there is shown a demodulator which operates in accordance with the present invention to demodulate a carrier signal having the phase angle modulation described above. An IF signal, modulated to have two phases during each signal period, is input to a mixer 132. A reference timing signal, such as a sine wave, is supplied to a frequency locked loop 134. The output of the frequency locked loop 134 is transmitted to a second input of the mixer 132. The output from mixer 132 is transmitted to a single sideband filter 136 and to a bandpass filter 138. The combination of the bandpass filter 138 and the frequency locked loop 134 serve to stablize the frequency of the IF signal received by the single sideband filter 132 thereby substantially eliminating frequency variations due to Doppler shift.

Within the single sideband filter 136 the IF signal is time averaged to produce the vector sum of the vector signal samples A and B, described above, and thereby produce the resultant vector R. The resultant vector R includes both magnitude and phase information. The averaged IF signal from single sideband filter 136 is transmitted to a mixer 140 where the IF signal is mixed with the output from a crystal controlled oscillator 142. The mixing of the phase modulated IF signal with the output of the crystal controlled oscillator 142 translates the IF signal to baseband while maintaining the modulation component. The baseband signal from mixer 140 is transmitted to a low pass filter 144 which filters the baseband signal and produces an audio output. Thus, the function of the demodulator shown in FIG. 6 is to average the two phase components transmitted during each signal period, frequency translate the IF signal, and detect the resultant signal to produce the audio output. The demodulator of FIG. 6 is further provided with means for eliminating frequency variation of the IF signal due to Doppler shift.

The demodulation technique of the present invention, as used in the demodulation shown in FIG. 6, is particularly useful for conferencing. A plurality of IF signals, having synchronized signal periods, can be simultaneously transmitted to the mixer 132. The signal samples are linearly averaged to produce a conference signal.

A representative single sideband filter for this application is a model FM-2873-2 manufactured by McCoy.

Figure 7:
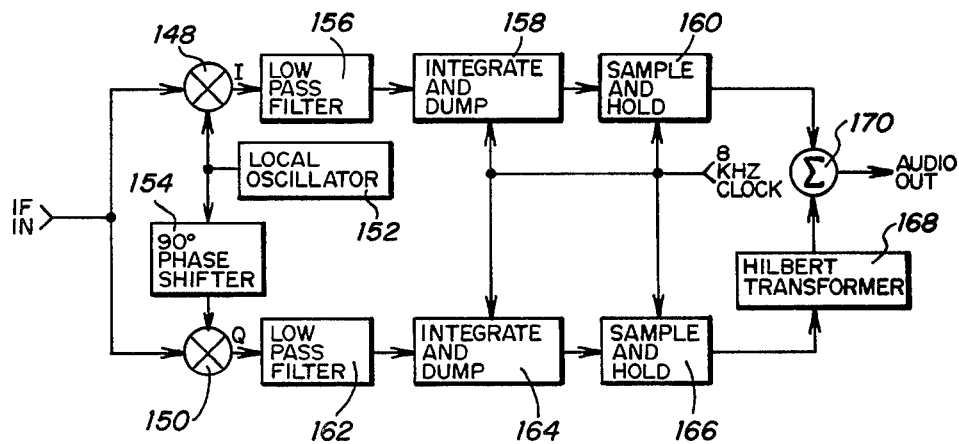
FIG. 7 is a block diagram of a further demodulator in accordance with the present invention.

A further demodulator in accordance with the present invention is illustrated in block diagram form in FIG. 7. The phase modulated IF signal, as described above, is transmitted simultaneously to two mixers, 148 and 150. Each of these mixers is provided with an input from a local oscillator 152. Mixer 148 is provided with a direct input from oscillator 152 while the input from oscillator 152 is transmitted to mixer 150 through a 90 degree phase shifter circuit 154. Due to the phase difference of the local oscillator signals provided to mixers 148 and 150, the outputs of the mixers are in quadrature. The output of mixer 148 is defined to be the I (inphase) channel while the output of mixer 150 is defined to be the Q (quadrature) channel. Both the I and Q channels have been translated to baseband by the action of the mixers 148 and 150.

The output of the mixer 148 is transmitted to a low pass filter 156 which blocks the high frequency components of the I-channel signal and conveys the resulting signal to an integrate and dump circuit 158. The input signal to circuit 158 is integrated and periodically supplied to a sample and hold circuit 160. Both the integrate and dump circuit 158 and the sample and hold circuit 160 are clocked at a rate of 8 khz in a preferred embodiment.

In a like manner the Q-channel signal is transmitted from mixer 150 to a low pass filter 162 and the filtered signal therefrom is conveyed to an integrate and dump circuit 164. The output of circuit 164 is transmitted to a sample and hold circuit 166 where the integrated signal is periodically sampled. Both the integrate and dump circuit 164 and the sample and hold circuit 166 are clocked by the 8 khz signal which is also supplied to the circuits 158 and 160. The sampled signal produced by sample and hold circuit 166 is passed through a Hilbert transformer 168 and the signal produced thereby is transmitted to a summing circuit 170. Within circuit 170 the output of sample and hold circuit 160 and the Hilbert transformed sample signal from circuit 168 are summed to produce an audio output signal.

The demodulator illustrated in FIG. 7 operates on baseband sampled data. The IF signal containing the single sideband pulse angle modulation is downconverted to baseband by mixing with quadrature signals from the local oscillator 152. The in-phase and quadrature phase channels are individually integrated, dumped, sampled and held at an 8 khz rate. The quadrature channel is Hilbert transformed and then added or subtracted from the I-channel to produce the audio output. The demodulator shown in FIG. 7 provides integration over the specific two phase periods which are transmitted to represent one vector for a signal component. In contrast, the demodulators described above in FIG. 6 integrate over all phase samples and due to such integration the demodulators can suffer from ringing of the single sideband filter due to the pulse nature of the PANG modulation. The baseband embodiment shown in FIG. 7 does not suffer such ringing type characteristics since the baseband signal is being sampled and held.

Each of the modulators and demodulators described above has been an analog device. However, many of the functions of modulation and demodulation under the method of the present invention can be carried out with the microprocessor. Two microprocessor based modulators and one microprocessor base demodulator are described in the following material.

Figure 8:
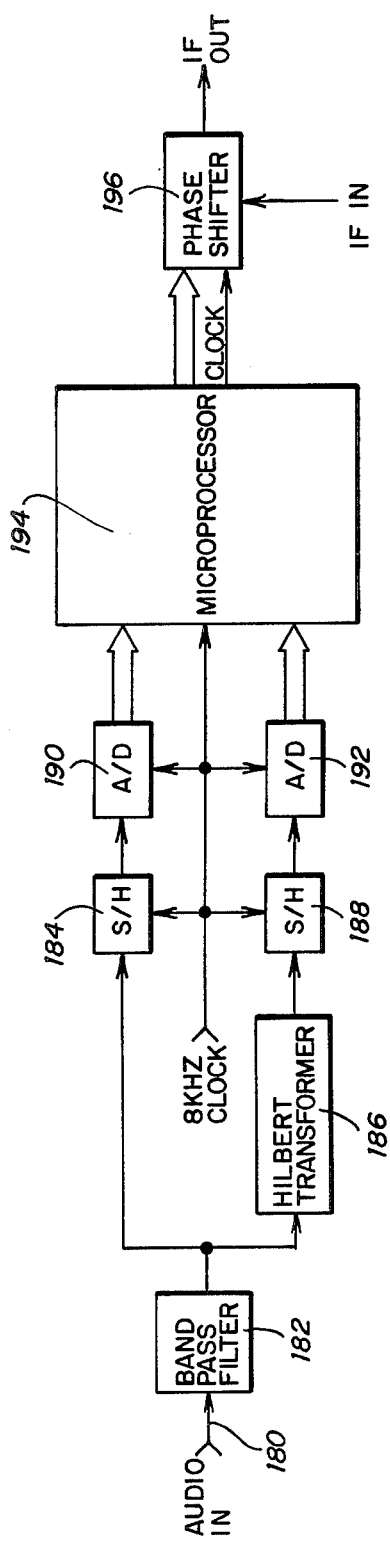
FIG. 8 is a block diagram of a microprocessor based modulator which operates in accordance with the present invention.

Referring now to FIG. 8, there is shown a microprocessor based modulator. An audio signal is received over a line 180 and transmitted through a bandpass filter 182. The bandpass filter 182 limits the audio signal to the useful frequency range for each transmission. The analog audio signal is transmitted directly from the filter 182 to a sample and hold circuit 184 which sequentially samples the analog signal. The analog audio signal is also transmitted through a Hilbert transformer 186 which produces the Hilbert transform of the input signal. The Hilbert transform of the audio signal is provided to a sample and hold circuit 188 which produces sequential analog signals.

The analog samples from circuit 184 are transmitted to analog-to-digital converter 190 and the Hilbert transformed samples are transmitted to an analog-to-digital converter 192.

The digital output from converters 190 and 192 are transmitted through a microprocessor 194. A clock signal, at a rate of 8 khz for this embodiment, is transmitted to control the operation of sample and hold circuits 184 and 188 and the analog-to-digital converters 190 and 192 as well as to the microprocessor 194. The microprocessor 194 carries out the mathematical functions described above in FIGS. 1 and 2. The microprocessor 194 produces digital signals to select the phase of each of the two phase segments of each signal sampled. These digital control signals are transmitted to a phase shifter circuit 196 which has a locally generated IF signal as an input. The digital control signals serve to modulate the IF signal and produce a modulated, single sideband, output signal as described above.

Figure 9:
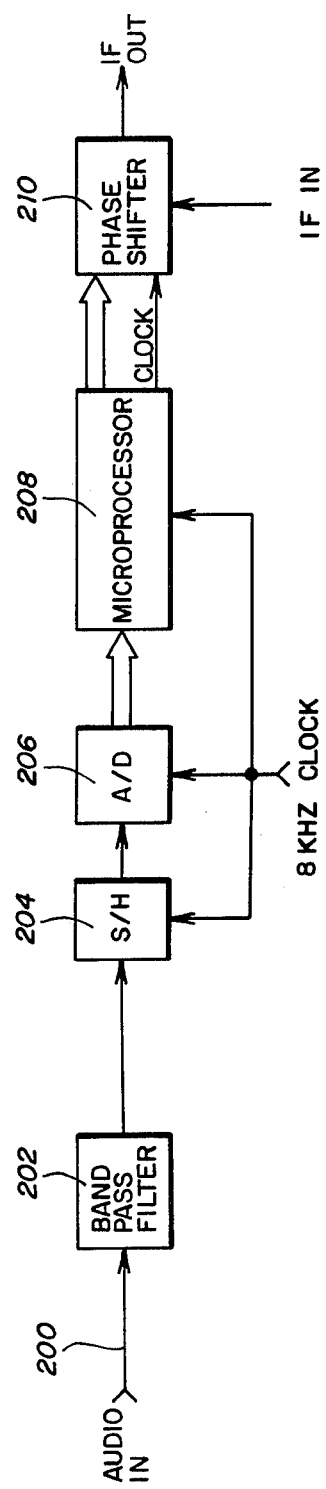
FIG. 9 is a block diagram of a further microprocessor based modulator which operates in accordance with the present invention.

A further microprocessor-based modulator is illustrated in FIG. 9. An audio input signal is transmitted through a line 200 to a bandpass filter 202. The filtered audio signal is then transmitted to a sample and hold circuit 204 which produces sequential analog signals of the input audio signal. The signal samples thus produced are transmitted to an analog-to-digital converter 206 which produces a series of digital words representing the analog input signal. The digital output produced by the converter 206 is transmitted to a microprocessor 208. The circuits 204, 206 and 208 are simultaneously clocked by an 8 khz clock signal.

The microprocessor 208 carries out the mathematical functions described above for modulation of the pulse angle modulator. It further curves out the mathematical function of making the Hilbert transform. The microprocessor 208 produces a digital signal which corresponds to each of the phase angles within each signal. These digital control signals are transmitted through a channel to a phase shifter 210 to modulate an input IF signal and produce the modulated single sideband IF signal of the present invention.

Figure 10:
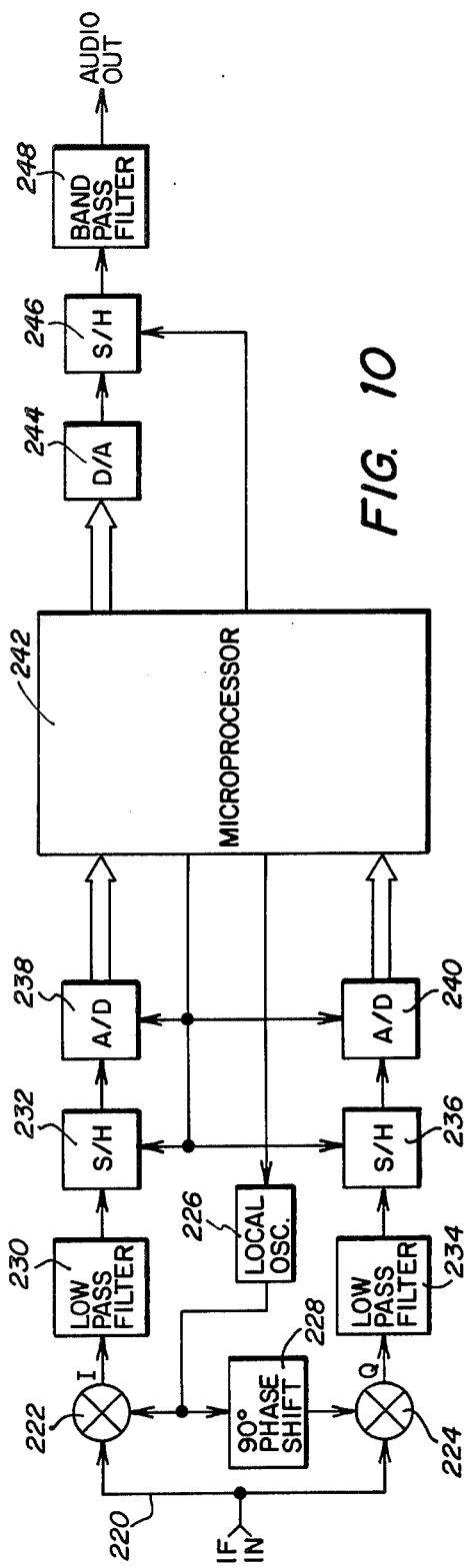
FIG. 10 is a block diagram of a microprocessor based demodulator which operates in accordance with the present invention.

A microprocessor-based demodulator for carrying out the demodulation function of the present invention is illustrated in FIG. 10. The modulated IF signal is input through a line 220 to mixers 222 and 224. A local oscillator 226, at approximately the IF frequency, produces a reference signal which is transmitted directly to the mixer 222 and is passed through a 90 degree phase shift circuit 228 to the mixer 224. The outputs of the mixers 222 and 224 are in quadrature and are termed respectively the I and Q channels.

The I-channel signal is transmitted through a low pass filter 230 to a sample and hold circuit 232. The Q-channel signal is transmitted through a low pass filter 234 to a sample and hold circuit 236.

The sampled I-channel signal from circuit 232 is converted to a digital word by an analog-to-digital converter 238. Likewise, the sampled Q-channel signal is converted into a digital word by an analog-to-digital converter 240. The outputs of converters 238 and 240 are provided to a microprocessor 242.

The microprocessor 242 receives a reference clock signal from the local oscillator 226. The circuits 232, 236, 238 and 240 are each activated by a clock signal received from the microprocessor 242.

The microprocessor 242 carries out the mathematical functions of averaging the two phase angles within each signal. The microprocessor further acts to recover the average carrier of the input IF signals and to alter the frequency of the local oscillator 226 in order to compensate for any Doppler shift on the incoming signals.

The microprocessor 242 produces a series of digital words corresponding to the demodulated signal samples. These digital words are transmitted to a digital-to-analog converter 244 to reproduce the analog signal levels. The analog signal levels from the converter 244 are transmitted to a sample and hold circuit 246 which is timed by a clock signal derived from the microprocessor 242. The clocked analog samples are then transmitted through a bandpass filter 248 to eliminate the sampling transients and thereby produce an audio output sample. If a plurality of IF signals are received through line 220 they will be simultaneously averaged and linearly combined to produce a conferenced signal at the audio output.

Figure 11:
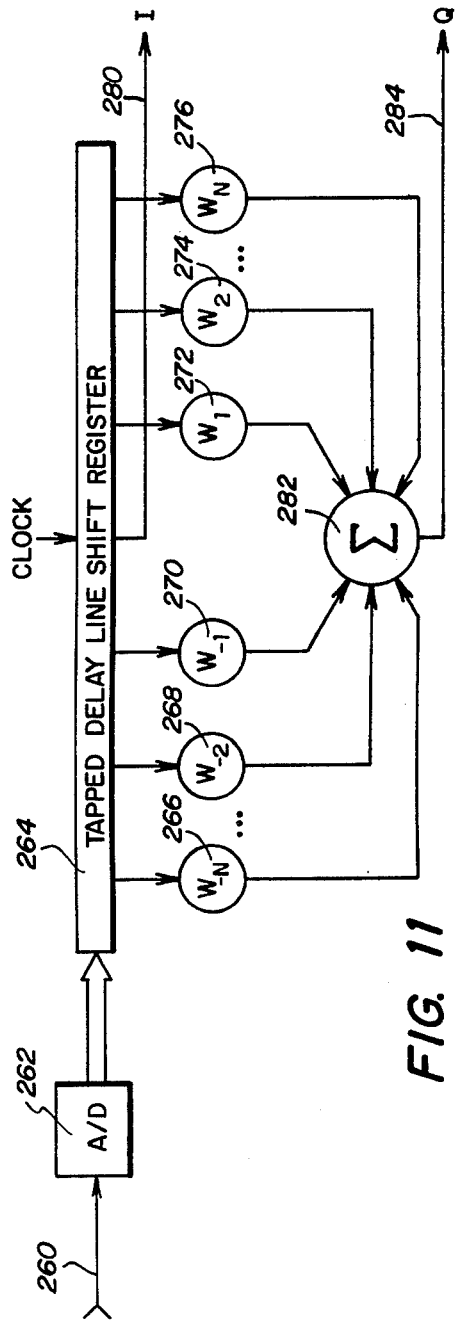
FIG. 11 is a functional illustration of a Hilbert transformer which can be used with the present invention.

A Hilbert transformer circuit is utilized in a number of the embodiments of the present invention. A detailed embodiment of such a transformer is illustrated in FIG. 11. An input analog signal is provided on a line 260 to an analog-to-digital converter 262 which produces a series of digital words. The digital words are transmitted through a channel to a tapped delay line shift register 264 in which the digital words are shifted through in response to a clock input. Each of the taps of register 264 is connected to a weighting circuit, as illustrated by circuit 266–276. The signal produced at each of the taps is weighted by addition of a constant which is indicated by the terms $W_{-N}$ through $W_N$. The digitized input signal itself is derived from a center tap 280 to produce the I-channel (in-phase) signal.

The outputs of each of the weighting circuits 266–276 are provided to a summation circuit 282. The digital inputs to circuit 282 are summed and provided to an output line 284 which transmits the Q-channel (out-of-phase) signal. The Q-channel signal is the Hilbert transform of the I-channel signal. Other circuit embodiments of a Hilbert transformer can be fabricated in accordance with techniques well-known in the art and described in texts on the subject.

Figure 12:
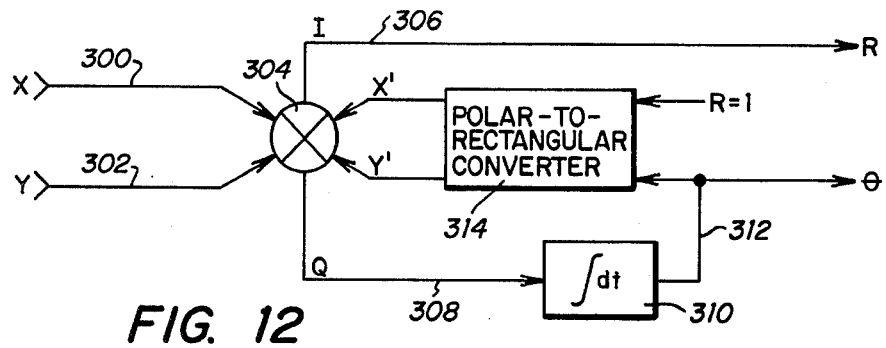
FIG. 12 is a block diagram of a rectangular two polar converter which can be used with the present invention.

The modulators described above utilize a rectangular-to-polar converter circuit. A converter circuit of this type is illustrated in FIG. 12. X and Y cartesian coordinate quantities are input on lines 300 and 302 to a mixer 304. The mixer 304 produces an in-phase and a quadrature output (I and Q) on lines 306 and 308 respectively. The I-channel output is the R component of the polar coordinates. The Q-channel component is input to an integrator 310 and the integrated output is transmitted through a line 312. The output signal on line 312 is the $\theta$ component of the polar vector.

A polar-to-rectangular converter 314 receives the angle $\theta$ signal as a first input and a unity R vector quantity as a second input. The converter 314 produces X' and Y' output signals which are transmitted to the mixer 304. Thus, a closed loop is formed between the mixer 304, the integrator 310 and the converter 314. When the analog X and Y cartesian coordinates are input on lines 300 and 302, the corresponding polar coordinates R vector and phase angle $\theta$ are produced in analog fashion on lines 306 and 312.

Figure 13:
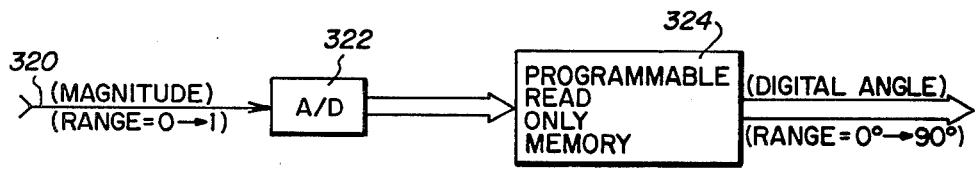
FIG. 13 is a block diagram of a magnitude-to-angle converter which can be used with the present invention.
Figure 14:
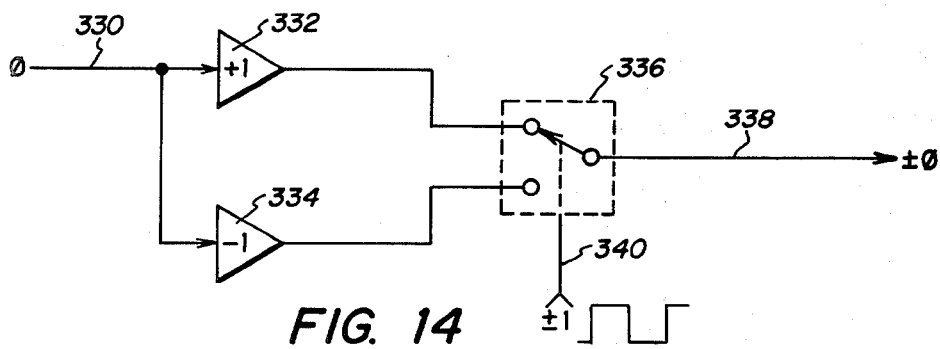
FIG. 14 is a block diagram of an angle alternator as can be used with the present invention.

A magnitude-to-angle converter circuit is utilized in a number of the embodiments of the modulator of the present invention. A converter of this type is illustrated in FIG. 13. A magnitude quantity having a range of 0 to 1 is input on a line 320 to an analog-to-digital converter 322. A sequence of digital words is produced by the converter 322 and these digital words are input to a programmable read only memory 324. The memory 324 is programmed with a look-up table which makes a direct conversion from each input magnitude to a corresponding angle. The angles are limited to be in the range of 0 to 90 degrees. Therefore, for each sampled analog input, the memory 324 produces a corresponding digital angle.

An angle alternator circuit as utilized in embodiments of the modulator described above is illustrated in FIG. 14. The angle $\phi$ signal is input on a line 330 to the input of a noninverting amplifier 332. The angle $\phi$ signal is also supplied to the input of an inverting amplifier 334. The output of amplifier 332 is connected to the first input of a switch 336. The output of amplifier 334 is connected to the second input of switch 336. The output of switch 336 is connected to the line 338 which transmits the positive and negative of the input angle $\phi$ signal. The operating element of the switch 336 is driven by a clock signal which is transmitted through a line 340 to alternately connect the output line 338 to the input lines.

A linear phase modulator as utilized in the circuits described above is illustrated in FIG. 15. A reference frequency is input on a line 350 to a mixer 352. The output of mixer 352 is transmitted to an adder 354 which receives the modulation signal $\theta \pm \phi$ at the second input thereto.

The output of the adder 354 is transmitted through a loop filter 356 to a voltage controlled oscillator 358. The oscillator 358 produces a signal at the desired IF frequency on a line 360. The output of oscillator 358 is also connected to the input of a divide-by-N circuit 362. Circuit 362 produces an output at a line 364 where the output is at a sub-multiple of the frequency on line 360. The output from circuit 362 is provided as a second input to mixer 352.

Figure 15:
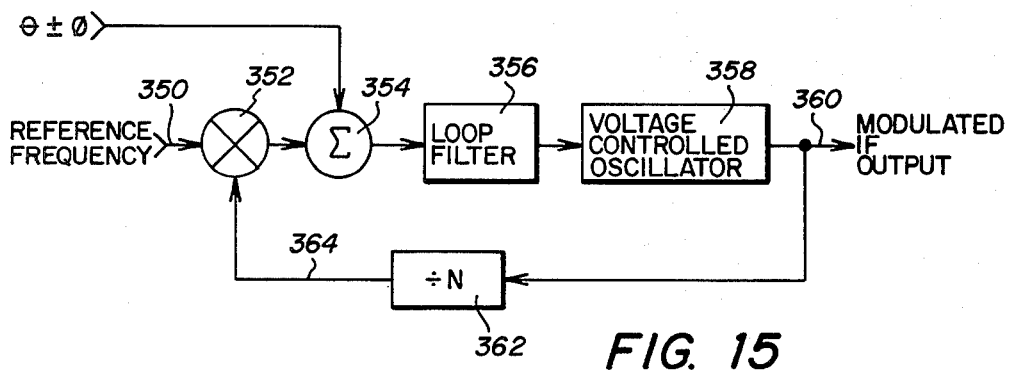
FIG. 15 is a block diagram of a linear phase modulator as can be used with the present invention.

Further referring to FIG. 15, the reference frequency on line 350 is mixed with the feedback signal which is received through line 364. The output of the mixer 352 is the error signal, which is then added with the modulation signal $\theta \pm \phi$ to produce a control signal at the output of adder 354. The control signal thus produced is transmitted through the loop filter 356 which controls the bandwidth of the loop. The control signal from the output of loop filter 356 is utilized to set the frequency of the signal produced by oscillator 358. The output signal from the oscillator is then transmitted as a modulated IF signal and also is transmitted through the divide-by-N circuit 362 to produce the feedback signal. The loop is phase locked for each modulation phase angle input to the mixer 354. The bandwidth of the loop must be substantially greater than the bandwidth at the input phase angle modulation to provide rapid slewing from one phase angle to another.

Figure 16:
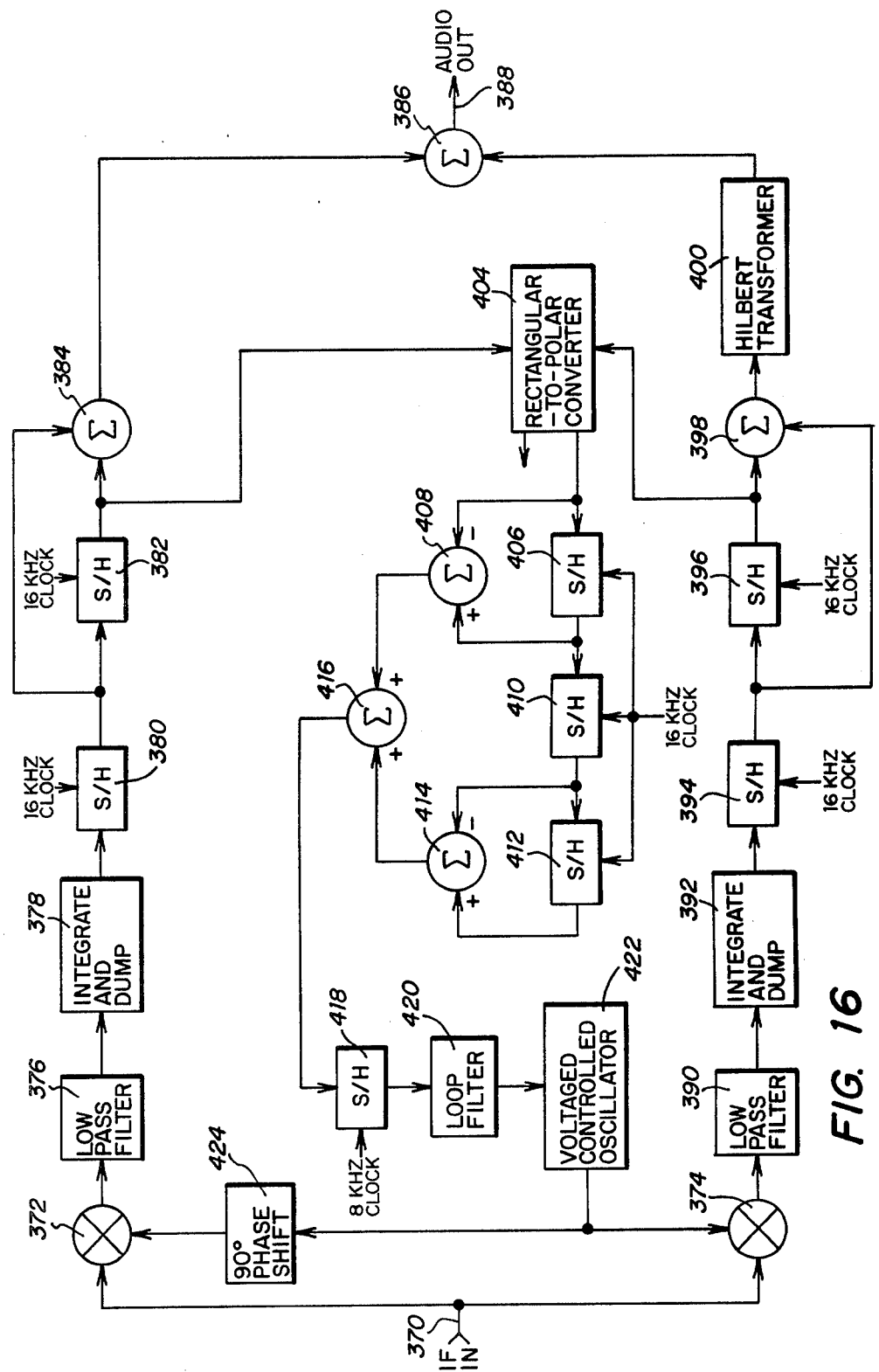
FIG. 16 is a block diagram of a frequency locked loop demodulator in accordance with the present invention.

A frequency locked loop demodulator is generally described above. A detailed block diagram of such a demodulator is shown in FIG. 16. The IF input is transmitted through a line 370 to mixers 372 and 374. The output of mixer 372 is transmitted through a low pass filter 376 to an integrate and dump circuit 378. The sequentially integrated signal produced by circuit 378 is sampled by a sample and hold circuit 380 which, in a preferred embodiment, is operated at a rate of 16 khz in response to an input clock signal. The sampled signals produced by circuit 380 are provided to a sample and hold circuit 382 and to a summation circuit 384. The output of sample and hold circuit 382 is provided to a second input of the summation circuit 384. The output of summation circuit 384 is then transmitted to another summation circuit 386 which produces the audio output signal for the demodulator on a line 388.

The output of mixer 374 is transmitted through a similar series of circuits as is the output of mixer 372. The output signal is first transmitted through a low pass filter 390 and then to an integrate and dump circuit 392.

The integrated signal produced by circuit 392 is sampled by a sample and hold circuit 394. The output of sample and hold circuit 394 is transmitted to a sample and hold circuit 396 and to a summation circuit 398. The sampled signal from circuit 396 is tranmitted to the second input of summation circuit 398. The summation signal produced by circuit 398 is input to a Hilbert transformer 400 which produces a Hilbert transform of the input signal of the output thereof. The Hilbert transformed signal is provided to the second input of summation circuit 386 to be summed with the output of circuit 384 to produce the audio output signal of the demodulator.

The frequency locked loop of the demodulator taps the outputs of sample and hold circuits 382 and 396 as cartesian coordinate inputs to a rectangular-to-polar converter 404. The converter 404 produces polar coordinates vector R at phase angle $\theta$. The angle $\theta$ signal is transmitted both to a sample and hold circuit 406 and a summation circuit 408. The sampled $\theta$ signal is sequentially transmitted from sample and hold circuit 406 to sample and hold circuits 410 and 412. Each of the sample and hold circuits 406, 410 and 412 is driven by a clock signal at a 16 khz rate in the preferred embodiment.

The output of sample and hold circuit 406 is input as the second input to summation circuit 408.

The output of sample and hold circuit 410 is supplied as the first input to a summation circuit 414 and the output of sample and hold circuit 412 is provided as the second input to circuit 414.

The summation signals produced by circuits 408 and 414 are input to a summation circuit 416 where they are algebraically added to produce a summation signal which is transmitted to a sample and hold circuit 418. Circuit 418 is driven by a 8 khz clock signal. The sampled summation signal is transmitted through a loop filter 420 to control the frequency of a voltage controlled oscillator 422. The output of oscillator 422 is transmitted directly as the second input to mixer 374 and is transmitted through a 90 degree phase shift circuit 424 to serve as the second input to a mixer 372.

Further referring to FIG. 16, it is the purpose of the circuit to compensate for frequency shifts in the carriers of the received signals. When a plurality of signals are received on line 370, the signal components are combined to produce a conferenced output at line 388. But if the carrier inputs of any of the input signals should be shifted, for example, due to Doppler shift, the average frequency of the carriers is changed and compensation is required in order to maintain the quality of the audio output signal.

A limitation in the operation of the circuit illustrated in FIG. 16 is that the modulation must follow a selected format. This format is that for the audio sample periods, the audio samples must have reverse alternations of the angle $\phi$. This is done as follows.

For the first audio sample the angle $\theta + \phi$ is followed by the angle $\theta - \phi$. For the second audio sample the angle $\theta - \phi$ is followed by the angle $\theta + \phi$. The process is then repeated. This modulation limitation does not affect the conferencing or the basic modulation characteristics of pulse angle modulation as described herein, but it does facilitate the operation of the carrier recovery scheme illustrated in FIG. 16.

The circuit in FIG. 16 basically operates by taking adjacent 16 khz samples which are angle $\theta + \phi$ and angle $\theta - \phi$. The difference is taken of these samples to leave the term $2\theta+$ an error term. The difference is then taken for the next succeeding reversed phase samples. The two differences are then summed and the contribution to the phase derivative with respect to time caused by the angle $\phi$ will cancel if angle $\phi$ has not changed in magnitude from one sample to the next. Since the magnitude of the audio envelope is slowly varying, there will be only small changes in angle $\phi$ from one sample to the next. With a sufficiently long time constant in the loop, the variations in the audio level can be averaged out to leave only the DC frequency offset component. This DC offset component will drive the voltage controlled oscillator 422 to return the audio output signal to the proper frequency.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

We claim:

1. A method for phase modulating a carrier signal to convey an information signal comprising the steps of:
   producing the Hilbert transform of the information signal;
   sampling the information signal and the Hilbert transform to produce time coincident sample signals which represent the amplitudes of orthogonal signal components of the information signal;
   converting the time coincident sample signals into an equivalent resultant vector quantity having an amplitude and an angle;
   converting the resultant vector quantity into two component vectors having equal substantially constant amplitudes and each having an angle, each component vector being oppositely offset from the resultant vector by an offset angle the cosine of which is proportional to the amplitude of the resultant vector; and
   sequentially phase modulating the carrier signal by each of the component vector angles during each sample period of the information signal, thereby maintaining a constant amplitude envelope for the carrier signal.

2. The method recited in claim 1 wherein the step of converting the time coincident sample signals into an equivalent resultant vector quantity comprises squaring the analog sample signals, summing the squared signals, and taking the square root of the summed squared signals.

3. Apparatus for modulating a carrier signal to convey an information signal, comprising:
   means for producing a Hilbert transform signal of the information signal;
   means utilizing the information signal and the Hilbert transform signal for producing a polar vector signal, said polar vector signal comprising the polar vector equivalent of the time coincident values of said information signal and said Hilbert transform signal;
   means for generating from said polar vector signal a first phase angle signal having a phase advanced by the angle $\phi$ from the polar vector signal and a second phase angle signal having a phase trailing by said angle $\phi$ from the polar vector signal; and
   means for sequentially phase modulating said carrier signal by each of the phase angle signals, thereby producing said modulated carrier signal which has a constant carrier envelope.

4. Apparatus as recited in claim 3 wherein said means for producing a polar vector signal comprises a linear analog multiplier which derives the square root of the sum of the squares of the time coincident values of said information signal and said Hilbert transform signal and an analog cosine circuit which derives the polar phase angle utilizing said square root which comprises the amplitude of the polar vector signal.

* * * * *